United States Patent
Wu et al.

(10) Patent No.: US 9,543,319 B1
(45) Date of Patent: Jan. 10, 2017

(54) VERTICAL CHANNEL STRUCTURE

(71) Applicant: MACRONIX International Co., Ltd., Hsinchu (TW)

(72) Inventors: Tin-Wei Wu, Hsinchu (TW); Chih-Hsiang Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/946,601

(22) Filed: Nov. 19, 2015

(51) Int. Cl.
| | | |
|---|---|---|
| H01L 27/11 | (2006.01) | |
| H01L 27/24 | (2006.01) | |
| H01L 29/78 | (2006.01) | |
| H01L 29/66 | (2006.01) | |
| H01L 21/76 | (2006.01) | |
| H01L 27/115 | (2006.01) | |
| H01L 29/792 | (2006.01) | |
| H01L 29/788 | (2006.01) | |
| H01L 29/786 | (2006.01) | |
| H01L 21/764 | (2006.01) | |

(52) U.S. Cl.
CPC ... H01L 27/11582 (2013.01); H01L 27/11568 (2013.01); *H01L 21/764* (2013.01); *H01L 27/11556* (2013.01); *H01L 27/2454* (2013.01); *H01L 29/66666* (2013.01); *H01L 29/7827* (2013.01); *H01L 29/7889* (2013.01); *H01L 29/78642* (2013.01); *H01L 29/7926* (2013.01)

(58) Field of Classification Search
CPC ............. H01L 27/11582; H01L 27/11568; H01L 27/11556; H01L 27/2454; H01L 29/7926; H01L 29/7889; H01L 29/66666; H01L 29/7827; H01L 29/78642; H01L 21/764

See application file for complete search history.

(56) References Cited

U.S. PATENT DOCUMENTS

| | | | | |
|---|---|---|---|---|
| 8,569,827 B2* | 10/2013 | Lee | ................... | H01L 27/11582 257/315 |
| 8,658,499 B2* | 2/2014 | Makala | ............. | H01L 21/28273 257/314 |
| 8,980,731 B2* | 3/2015 | Kim | ........................ | H01L 21/04 257/314 |
| 9,064,736 B2* | 6/2015 | Lee | ...................... | H01L 27/1157 |
| 9,224,749 B1* | 12/2015 | Guo | ...................... | H01L 21/764 |
| 9,287,288 B2* | 3/2016 | Yasuda | ............. | H01L 27/11565 |
| 9,356,043 B1* | 5/2016 | Sakakibara | ....... | H01L 27/11582 |
| 9,412,752 B1* | 8/2016 | Yeh | ................... | H01L 27/11565 |

(Continued)

*Primary Examiner* — Ida M Soward
(74) *Attorney, Agent, or Firm* — J.C. Patents (57) ABSTRACT

A vertical channel structure including a substrate, a plurality of stacked structures, a charge storage structure, a channel structure and a dielectric structure is provided. The stacked structures are disposed on the substrate. An opening is located between the stacked structures. The charge storage structure is disposed on a sidewall of the opening. The channel structure is disposed on the charge storage structure and on the substrate at a bottom portion of the opening. The dielectric structure includes first and second dielectric layers. The first dielectric layer is disposed on the channel structure. The second dielectric layer is disposed on the first dielectric layer and seals the opening to form a void in the dielectric structure. A top portion of the second dielectric layer is higher than a top portion of the first dielectric layer. The dielectric structure exposes an upper portion of the channel structure.

10 Claims, 5 Drawing Sheets

(56) References Cited

U.S. PATENT DOCUMENTS

| | | | |
|---|---|---|---|
| 2011/0233648 A1 | 9/2011 | Seol et al. | |
| 2015/0179661 A1* | 6/2015 | Huo | H01L 21/764 257/57 |
| 2015/0279857 A1* | 10/2015 | Kim | H01L 27/11582 438/269 |
| 2015/0380431 A1* | 12/2015 | Kanamori | H01L 27/11582 257/324 |
| 2016/0027796 A1* | 1/2016 | Yang | H01L 27/11573 257/314 |
| 2016/0056169 A1* | 2/2016 | Lee | H01L 27/11582 438/269 |
| 2016/0148947 A1* | 5/2016 | Seo | H01L 27/11565 257/324 |
| 2016/0204115 A1* | 7/2016 | Ko | H01L 27/11582 257/329 |
| 2016/0240551 A1* | 8/2016 | Lai | H01L 27/11582 |
| 2016/0247814 A1* | 8/2016 | Lai | H01L 27/11582 |

\* cited by examiner

VERTICAL CHANNEL STRUCTURE

BACKGROUND OF THE INVENTION

Field of the Invention

The invention relates to a channel structure, and more particularly, relates to a vertical channel structure.

Description of Related Art

With continuous development of technologies, advancements in electronic devices lead to increasing demands for greater storage capabilities. In order to satisfy the need for high storage density, memory devices are designed to include smaller size and higher integration. Accordingly, a structure of the memory device has been developed to change from a 2D memory device with a planar gate structure into a 3D memory device with a vertical channel (VC) structure.

During a manufacturing process of the 3D memory device with the vertical channel structure, because a high aspect ratio of a VC hole will reduce a capability of a dielectric material for filling the VC hole, a void is easily formed in the dielectric material filled in the VC hole.

In the subsequent process of forming a plug for channel pick up, a conductive material for forming the plug often passes through the dielectric material to enter the void. As a result, an undesired potential may be generated to lower performance of the memory device.

SUMMARY OF THE INVENTION

The invention is directed to a vertical channel structure, which is capable of effectively preventing the conductive material from entering the void of the dielectric structure.

The invention provides a vertical channel structure, which includes a substrate, a plurality of stacked structures, a charge storage structure, a channel structure and a dielectric structure. The stacked structures are disposed on the substrate. An opening is located between the stacked structures. The charge storage structure is disposed on a sidewall of the opening. The channel structure is disposed on the charge storage structure and on the substrate at a bottom portion of the opening. The dielectric structure includes a first dielectric layer and a second dielectric layer. The first dielectric layer is disposed on the channel structure. The second dielectric layer is disposed on the first dielectric layer and seals the opening to form a void in the dielectric structure. A top portion of the second dielectric layer is higher than a top portion of the first dielectric layer. The dielectric structure exposes an upper portion of the channel structure.

According to an embodiment of the invention, in the vertical channel structure, each of the stacked structures includes a plurality of first material layers and a plurality of second material layers. The first material layers and the second material layers are disposed in an alternately stacked manner.

According to an embodiment of the invention, in the vertical channel structure, a material of the first material layers is, for example, a first dielectric material. A material of the second material layers is, for example, a second dielectric material or a conductive material.

According to an embodiment of the invention, in the vertical channel structure, the charge storage structure is, for example, a charge trapping structure.

According to an embodiment of the invention, in the vertical channel structure, the charge trapping structure is, for example, a composite layer of silicon oxide layer-silicon nitride layer-silicon oxide layer (ONO).

According to an embodiment of the invention, in the vertical channel structure, the channel structure includes a channel spacer and a channel body layer. The channel spacer is disposed on the charge storage structure. The channel body layer is disposed on the channel spacer and on the substrate at the bottom portion of the opening.

According to an embodiment of the invention, in the vertical channel structure, in one same etching process, an etching rate of the first dielectric layer is, for example, higher than an etching rate of the second dielectric layer.

According to an embodiment of the invention, in the vertical channel structure, in one same etching process, a material of the first dielectric layer is, for example, a low-temperature oxide, and a material of the second dielectric layer is, for example, a high density plasma oxide (HDP oxide).

According to an embodiment of the invention, in the vertical channel structure, the opening above the dielectric structure has a W-shape contour outline, for example.

According to an embodiment of the invention, the vertical channel structure further includes a plug. The plug is disposed on the dielectric structure and fills the opening.

Based on the above, in the vertical channel structure proposed according to the invention, because the top portion of the second dielectric layer is higher than the top portion of the first dielectric layer, the dielectric structure having the upper portion in convex shape may be formed. Accordingly, in the subsequent process of forming the plug used for channel pick up, because a convex portion of the dielectric structure is located above the void, the convex portion of the dielectric structure can protect the void therebelow. Therefore, the conductive material for forming the plug may be effectively prevented from entering the void, so as to improve reliability and performance of the memory device. Further, because the convex portion of the dielectric structure can protect the void therebelow, the opening for forming the plug above the dielectric structure can be further enlarged. As a result, a contact area of the plug and the channel structure may be effectively increased to improve performance of the memory device.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are cross-sectional views of a manufacturing process of a vertical channel structure according to an embodiment of the invention.

Figure 1A:
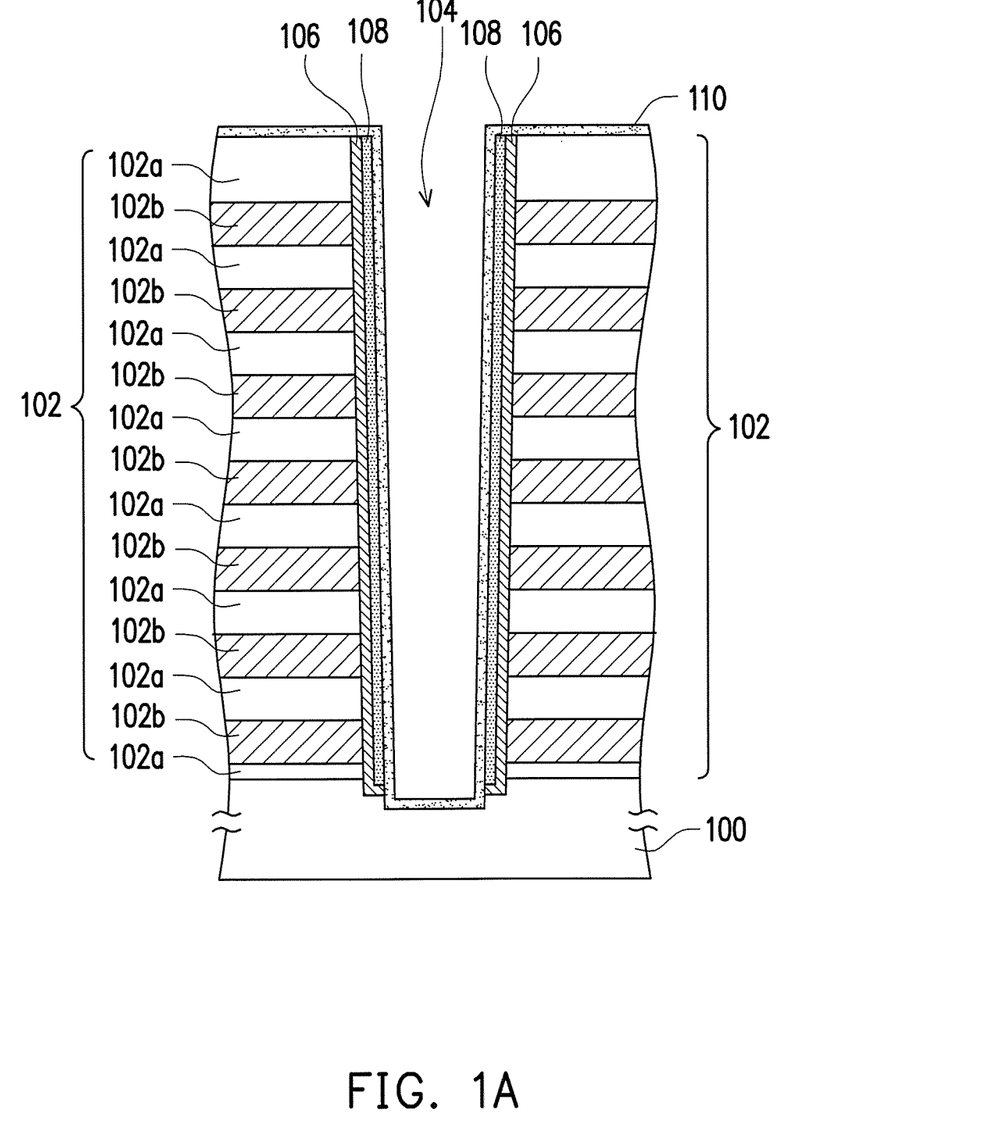
FIG. 1A to FIG. 1E are cross-sectional views of a manufacturing process of a vertical channel structure according to an embodiment of the invention.

Referring to FIG. 1A, a substrate 100 is provided. The substrate 100 is, for example, a semiconductor substrate, such as a silicon substrate. A plurality of stacked structures 102 are formed on the substrate 100. An opening 104 is located between the stacked structures 102. Each of the stacked structures 102 includes a plurality of material layers 102a and a plurality of material layers 102b. The material layers 102a and the material layers 102b are disposed in an alternately stacked manner. A material of the material layers 102a is, for example, a first dielectric material, such as a silicon oxide. A material of the material layers 102b is, for example, a second dielectric material or a conductive material, wherein the first dielectric material and the second dielectric material are, for example, different dielectric materials. The second dielectric material is, for example, a silicon nitride, and the conductive material is, for example, tungsten or a doped polysilicon. A forming method of the stacked structure 102 includes, for example, after forming a stacked material layer (not illustrated) on the substrate 100 by a deposition process, performing a patterning process to the stacked material layer. Nevertheless, the forming method of the stacked structure 102 of the invention is not limited to the above. Further, while performing the patterning process to the stacked structure layer, an over-etching process may be performed to ensure that a portion of the stacked structure layer at the lowermost layer which requires to be removed can indeed be etched and removed, so as to define a pattern of the stacked structure 102. In addition, during the over-etching process, a portion of the substrate 100 may be removed.

A charge storage structure 106 is formed on a sidewall of the opening 104. The charge storage structure 106 is, for example, a charge trapping structure, such as a composite layer of silicon oxide layer-silicon nitride layer-silicon oxide (ONO) layer.

A channel spacer 108 is formed on the charge storage structure 106. A material of the channel spacer 108 is, for example, a semiconductor material, such as a polysilicon.

A forming method of the charge storage structure 106 and the channel spacer 108 includes, for example, after forming a charge storage structure layer (not illustrated) and a channel spacer material layer (not illustrated) on the stacked structure 102 and in the opening 104 by a deposition process, performing an etching back process to the charge storage structure layer and the channel spacer material layer. Nevertheless, the forming method of the charge storage structure 106 and the channel spacer 108 of the invention is not limited to the above. Further, while performing the etching back process, an over-etching process may be performed to ensure that the charge storage structure 106 located at a bottom portion of the opening 104 can be removed to expose the substrate 100. In addition, during the over-etching process, a portion of the substrate 100 may be removed.

A channel body material layer 110 is formed on the channel spacer 108 and the substrate 100 at the bottom portion of the opening 104. A material of the channel body material layer 110 is, for example, a semiconductor material, such as a polysilicon. A forming method of the channel body material layer 110 is, for example, a chemical vapor deposition.

Figure 1B:
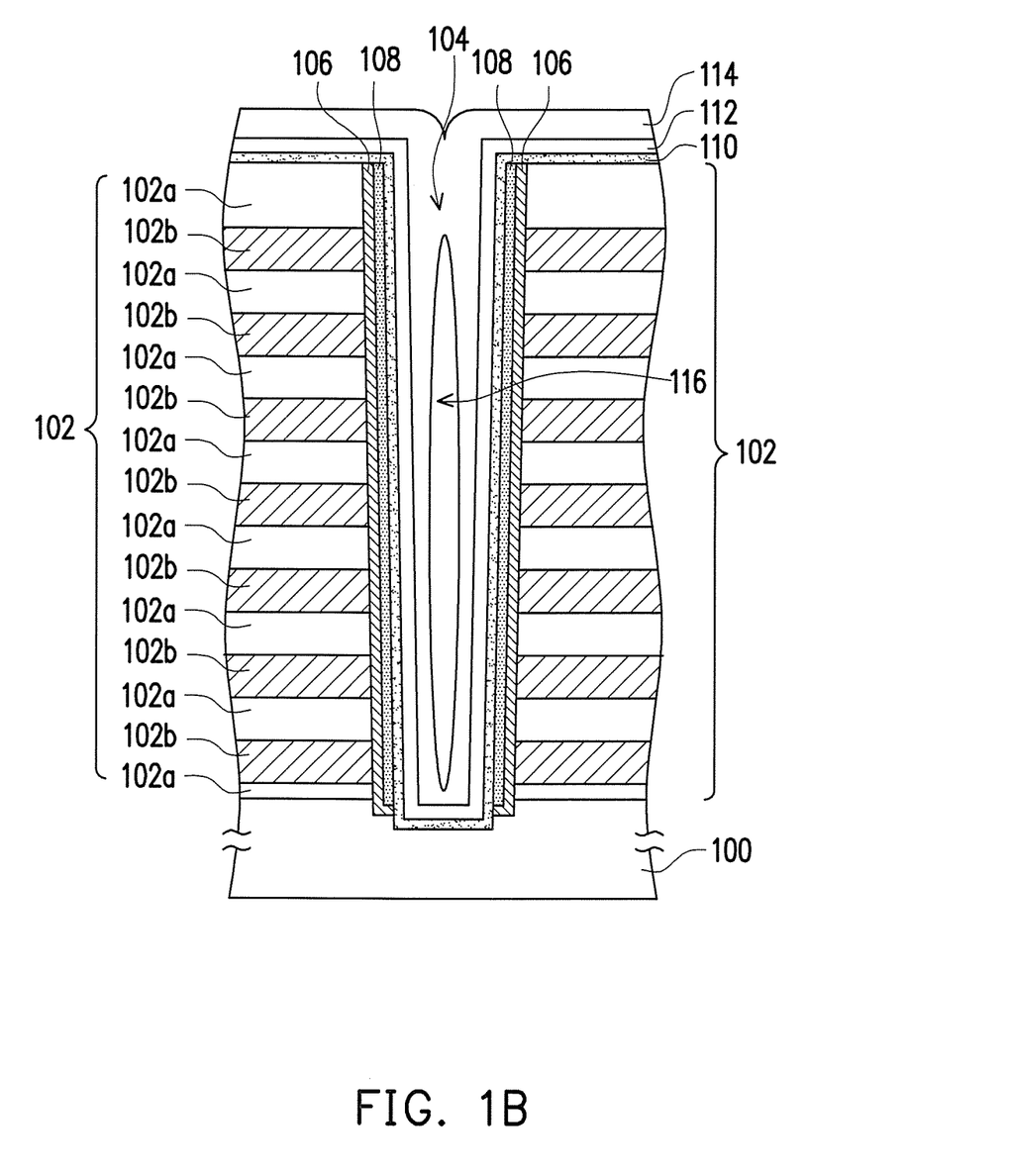

Referring to FIG. 1B, a dielectric material layer 112 is formed on the channel body material layer 110. A material of the dielectric material layer 112 is, for example, a low-temperature oxide. A forming method of the dielectric material layer 112 is, for example, a low-pressure chemical vapor deposition (LPCVD).

A dielectric material layer 114 is formed on the dielectric material layer 112. The dielectric material layer 114 seals the opening 104 to form a void 116 in the dielectric material layer 114. A material of the dielectric material layer 114 is, for example, a high density plasma oxide. A forming method of the dielectric material layer 114 is, for example, a high density plasma chemical vapor deposition (HDPCVD). Further, the dielectric material layer 112 and the dielectric material layer 114 have different etching rates. For instance, in one same etching process, an etching rate of the dielectric material layer 112 is, for example, higher than an etching rate of the dielectric material layer 114.

Figure 1C:
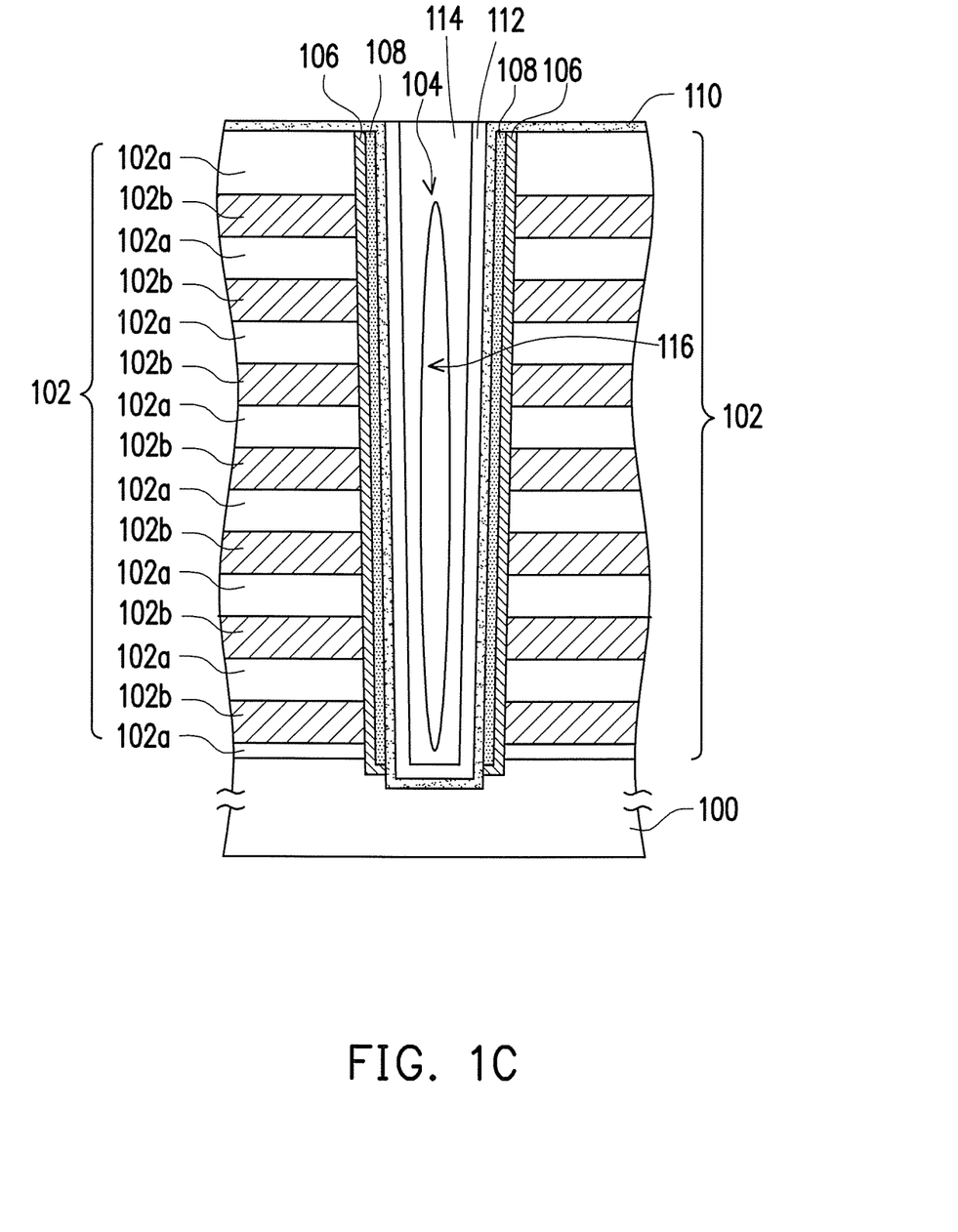

Referring to FIG. 1C, the dielectric material layer 112 and the dielectric material layer 114 outside the opening 104 are removed. A removing method of the dielectric material layer 112 and the dielectric material layer 114 outside the opening 104 includes, for example, performing a planarization process to the dielectric material layer 112 and the dielectric material layer 114 by using the channel body material layer 110 as a stop layer. Herein, the planarization process adopts, for example, a chemical-mechanical polishing method or an etching back process.

Figure 1D:
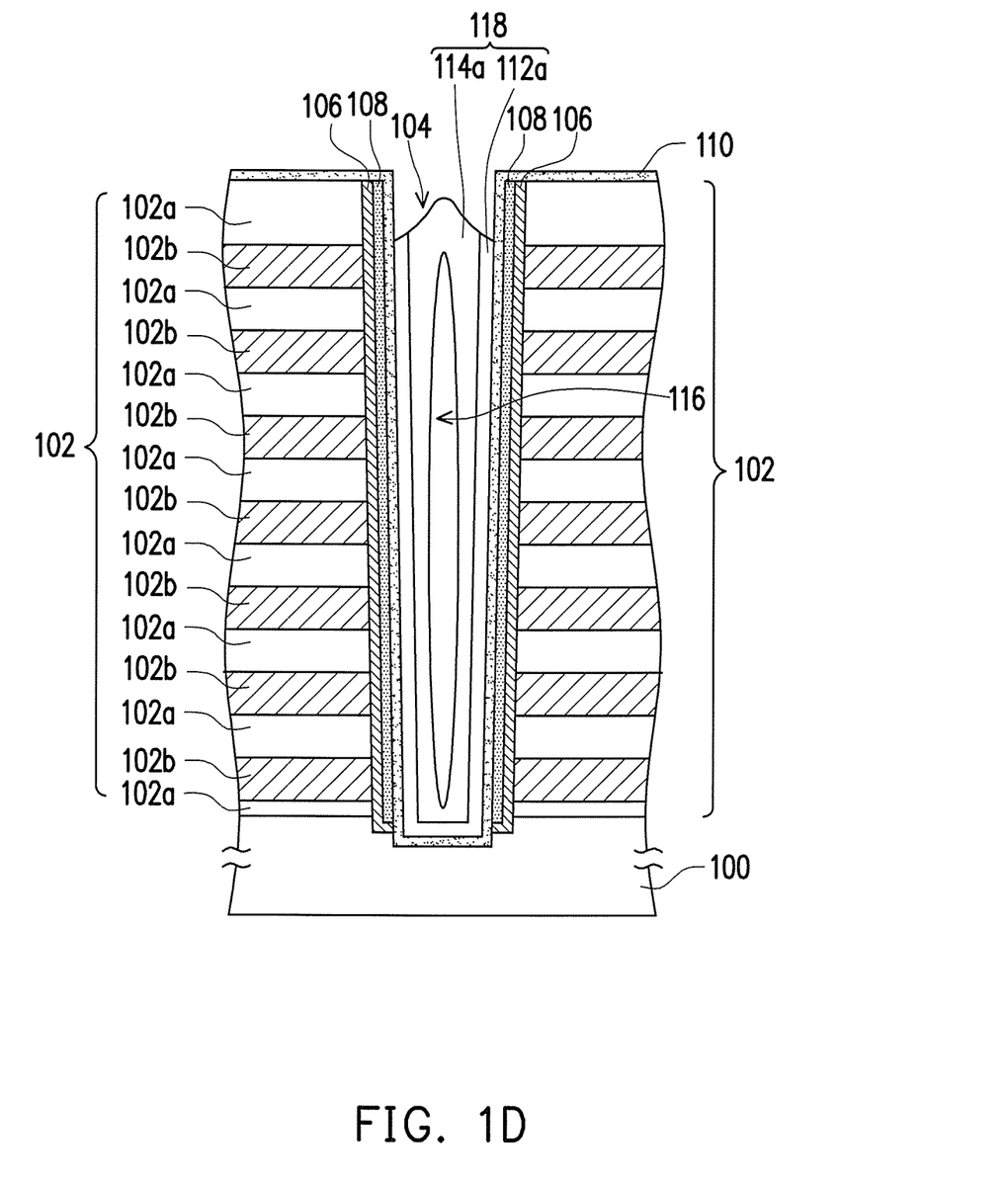

Referring to FIG. 1D, a portion of the dielectric material layer 112 and a portion of the dielectric material layer 114 are removed to form a dielectric structure 118 including a dielectric layer 112a and a dielectric layer 114a. Although the dielectric structure 118 is formed by aforesaid method, the invention is not limited thereto. Because a top portion of the dielectric layer 114a is higher than a top portion of the dielectric layer 112a, the dielectric structure 118 having an upper portion in convex shape may be formed. The dielectric structure 118 exposes an upper portion of the channel body material layer 110. Further, the top portion of the dielectric layer 112a is, for example, higher than a top portion of the topmost material layer 102b. At this time, the opening 104 above the dielectric structure 118 has a W-shape contour outline, for example.

A removing method of the portion of the dielectric material layer 112 and the portion of the dielectric material layer 114 includes, for example, performing a wet etching process to the portion of the dielectric material layer 112 and the portion of the dielectric material layer 114. In said wet etching process, since the etching rate of the dielectric material layer 112 is higher than the etching rate of the dielectric material layer 114, the top portion of the dielectric layer 114a can be higher than the top portion of the dielectric layer 112a so that the dielectric structure 118 having the upper portion in convex shape can be formed. For example, the wet etching process is a two-steps wet etching process. In the first etching step, the etching process is performed by using an etchant of $HF/H_2O$ (50:1) for 260 seconds at 25° C. In the second etching step, the etching process is performed by using an etchant of $HF/H_2O$ (200:1) for 80 seconds at 25° C.

Figure 1E:
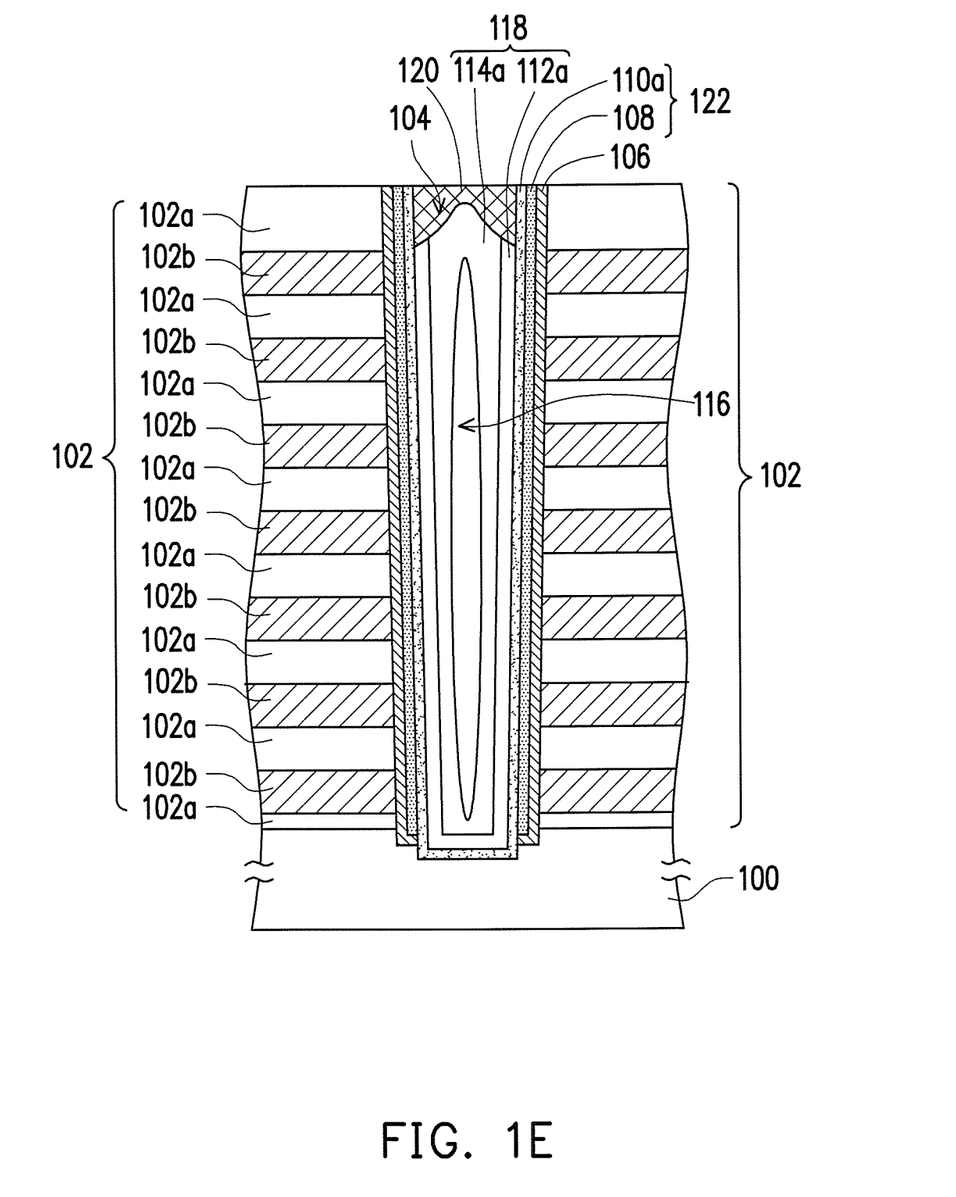

Referring to FIG. 1E, a plug 120 filling the opening 140 is formed on the dielectric structure 118 and can be used for channel pick up. A material of the plug 120 is, for example, a conductive material, such as a doped polysilicon. For instance, a forming method of the plug 120 may includes the following steps. A plug material layer (not illustrated) filling the opening 104 is formed by a deposition process. A planarization process is performed to the plug material layer by using the topmost material layer 102a as a stop layer so that the plug material layer outside the opening 104 is removed to form the plug 120. Herein, the planarization process adopts, for example, a chemical-mechanical polishing method. Further, in aforesaid planarization process, the channel body material layer 110 outside the opening 104 may be removed together to form a channel body layer 110a, wherein a channel structure 122 may be formed by the channel body layer 110a and the channel spacer 108. Although the channel structure 122 is formed by aforesaid method, the invention is not limited thereto.

Based on the foregoing embodiments, it can be known that in the vertical channel structure, because the top portion of the dielectric layer 114a is higher than the top portion of the dielectric layer 112a, the dielectric structure 118 having the upper portion in convex shape may be formed. Accordingly, in the subsequent process of forming the plug 120 used for channel pick up, because a convex portion of the dielectric structure 118 is located above the void 116, the convex portion of the dielectric structure 118 can protect the void 116 therebelow. Therefore, the conductive material for forming the plug 120 may be effectively prevented from entering the void 116, so as to improve reliability and performance of the memory device. Further, because the convex portion of the dielectric structure 118 can protect the void 116 therebelow, the opening 104 for forming the plug 120 above the dielectric structure 118 can be further enlarged. As a result, a contact area of the plug 120 and the channel structure 122 may be effectively increased to improve performance of the memory device.

Hereinafter, the vertical channel structure of the present embodiment is described with reference to FIG. 1E.

Referring to FIG. 1E, a vertical channel structure includes a substrate 100, a plurality of stacked structures 102, a charge storage structure 106, a channel structure 122 and a dielectric structure 118. The stacked structures 102 are disposed on the substrate 100. An opening 104 is located between the stacked structures 102. The stacked structure 102 includes a plurality of material layers 102a and a plurality of material layers 102b, which are disposed in an alternately stacked manner. The charge storage structure 106 is disposed on a sidewall of the opening 104. The channel structure 122 is disposed on the charge storage structure 106 and on the substrate 100 at a bottom portion of the opening 104. The channel structure 122 includes a channel spacer 108 and a channel body layer 110a. The channel spacer 108 is disposed on the charge storage structure 106. The channel body layer 110a is disposed on the channel spacer 108 and on the substrate 100 at the bottom portion of the opening 104. The dielectric structure 118 includes a dielectric layer 112a and a dielectric layer 114a. The dielectric layer 112a is disposed on the channel structure 122. The dielectric layer 114a is disposed on the dielectric layer 112a and seals the opening 104 to form a void 116 in the dielectric structure 118. A top portion of the dielectric layer 114a is higher than a top portion of the dielectric layer 112a so that the dielectric layer 118 has the upper portion in convex shape. The opening 104 above the dielectric structure 118 has a W-shape contour outline, for example. The dielectric structure 118 exposes an upper portion of the channel structure 122. The vertical channel structure further includes a plug 120. The plug 120 is disposed on the dielectric structure 118 and fills the opening 104. Moreover, the material, the disposition, the forming method and the effectiveness of each member in the vertical channel structure have been described in the aforesaid manufacturing method of FIG. 1A to FIG. 1E, which are not repeated hereinafter.

In summary, in the vertical channel structure according to the foregoing embodiments, because the top portion of the dielectric layer 114a is higher than the top portion of the dielectric layer 112a, the dielectric structure 118 having the upper portion in convex shape may be formed. Therefore, the conductive material for forming the plug 120 may be effectively prevented from entering the void 116, so as to improve reliability and performance of the memory device. In addition, the convex portion of the dielectric structure 118 can protect the void 116 therebelow. As a result, a contact area of the plug 120 and the channel structure 122 may be effectively increased to improve performance of the memory device.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A vertical channel structure, comprising:
   a substrate;
   a plurality of stacked structures, disposed on the substrate, wherein an opening is located between the stacked structures;
   a charge storage structure, disposed on a sidewall of the opening;
   a channel structure, disposed on the charge storage structure and on the substrate at a bottom portion of the opening; and
   a dielectric structure, comprising:
      a first dielectric layer, disposed on the channel structure; and
      a second dielectric layer, disposed on the first dielectric layer and sealing the opening to form a void in the dielectric structure, wherein a top portion of the second dielectric layer is higher than a top portion of the first dielectric layer, and the dielectric structure exposes an upper portion of the channel structure.

2. The vertical channel structure of claim 1, wherein each of the stacked structures comprises a plurality of first material layers and a plurality of second material layer, and the first material layers and the second material layers are disposed in an alternately stacked manner.

3. The vertical channel structure of claim 2, wherein a material of the first material layers comprises a first dielectric material, and a material of the second material layers comprises a second dielectric material or a conductive material.

4. The vertical channel structure of claim 1, wherein the charge storage structure comprises a charge trapping structure.

5. The vertical channel structure of claim 4, wherein the charge trapping structure comprises a composite layer of silicon oxide layer-silicon nitride layer-silicon oxide layer.

6. The vertical channel structure of claim 1, wherein the channel structure comprises:
   a channel spacer, disposed on the charge storage structure; and
   a channel body layer, disposed on the channel spacer and on the substrate at the bottom portion of the opening.

7. The vertical channel structure of claim 1, wherein in one same etching process, an etching rate of the first dielectric layer is higher than an etching rate of the second dielectric layer.

8. The vertical channel structure of claim 1, wherein a material of the first dielectric layer comprises a low-temperature oxide, and a material of the second dielectric layer comprises a high density plasma oxide.

9. The vertical channel structure of claim 1, wherein the opening above the dielectric structure has a W-shape contour outline.

10. The vertical channel structure of claim 1, further comprising a plug, disposed on the dielectric structure and filling the opening.

* * * * *